US009982361B2

(12) United States Patent
Chartier

(10) Patent No.: US 9,982,361 B2
(45) Date of Patent: May 29, 2018

(54) LIQUID-COOLED HEAT EXCHANGER

(75) Inventor: Carl Chartier, Manchester, NH (US)

(73) Assignee: GTAT Corporation, Merrimack, NH (US)

( * ) Notice: Subject to any disclaimer, the term of this patent is extended or adjusted under 35 U.S.C. 154(b) by 688 days.

(21) Appl. No.: 14/348,792

(22) PCT Filed: Jul. 17, 2012

(86) PCT No.: PCT/US2012/047061
§ 371 (c)(1),
(2), (4) Date: Jan. 11, 2016

(87) PCT Pub. No.: WO2013/019401
PCT Pub. Date: Feb. 7, 2013

(65) Prior Publication Data
US 2016/0130721 A1 May 12, 2016

Related U.S. Application Data

(60) Provisional application No. 61/514,019, filed on Aug. 1, 2011.

(51) Int. Cl.
*C30B 11/00* (2006.01)
*C30B 29/06* (2006.01)
(Continued)

(52) U.S. Cl.
CPC .......... *C30B 11/003* (2013.01); *C30B 11/002* (2013.01); *C30B 11/007* (2013.01);
(Continued)

(58) Field of Classification Search
CPC .............................. C30B 11/003; C30B 11/00
See application file for complete search history.

(56) References Cited

U.S. PATENT DOCUMENTS 5,135,047 A     8/1992 Dobran
6,136,091 A *  10/2000 Yamazaki ............... C30B 29/06
                                                    117/81
(Continued)

FOREIGN PATENT DOCUMENTS

EP     0781865 A2    7/1997
EP     0939146 A1    9/1999
(Continued)

OTHER PUBLICATIONS

English translation of Notification of Reason for Refusal dated Feb. 17, 2016 in connection with Japanese Application No. 2014-523949.

(Continued)

*Primary Examiner* — Robert M Kunemund
(74) *Attorney, Agent, or Firm* — Parker Ibrahim & Berg LLP; Stephen D. LeBarron

(57) ABSTRACT

A crystal growth furnace comprising a crucible containing at least feedstock material and a liquid-cooled heat exchanger that is vertically movable beneath the crucible to extract heat from it to promote the growth of a crystalline ingot is disclosed. The liquid-cooled heat exchanger comprises a heat extraction bulb made of high thermal conductivity material that is vertically movable into thermal communication with the crucible to extract heat from the crucible using a liquid coolant. A liquid-cooled heat exchanger enclosed in a sealed tubular outer jacket is also disclosed as is a method for producing a crystalline ingot using a vertically movable liquid-cooled heat exchanger.

35 Claims, 3 Drawing Sheets

(51) Int. Cl.
  *C30B 11/02* (2006.01)
  *F28D 15/00* (2006.01)
  *F28F 13/00* (2006.01)
(52) U.S. Cl.
  CPC .............. *C30B 11/02* (2013.01); *C30B 29/06* (2013.01); *F28D 15/00* (2013.01); *F28F 13/00* (2013.01)

(56) References Cited

U.S. PATENT DOCUMENTS

| | | | | |
|---|---|---|---|---|
| 2004/0261691 | A1* | 12/2004 | Doguchi | C30B 11/006 117/83 |
| 2006/0174822 | A1* | 8/2006 | Sumiya | C30B 11/002 117/81 |
| 2007/0227189 | A1 | 10/2007 | Sakai | |
| 2009/0013925 | A1 | 1/2009 | Servant et al. | |
| 2009/0090296 | A1 | 4/2009 | Gil et al. | |

FOREIGN PATENT DOCUMENTS

| | | |
|---|---|---|
| EP | 1867759 A1 | 12/2007 |
| JP | 63-166711 | 7/1988 |
| JP | 06-345585 A | 12/1994 |
| JP | 09-183606 A | 7/1997 |
| JP | 09-255484 A | 9/1997 |
| JP | 11-292696 | 10/1999 |
| JP | 2009-018987 A | 1/2009 |
| KR | 100 947 836 B1 | 3/2010 |
| WO | 2010/005705 A1 | 1/2010 |
| WO | WO-2011/048473 A1 | 4/2011 |

OTHER PUBLICATIONS

European Search Report dated Oct. 1, 2014 issued in connection with EP 12820600.
International Search Report dated Jan. 17, 2013 issued in connection with PCT/US2012/047061.
Office Action dated Oct. 26, 2015 issued in connection with Chinese Application No. 201280048372.0, with English translation.

* cited by examiner

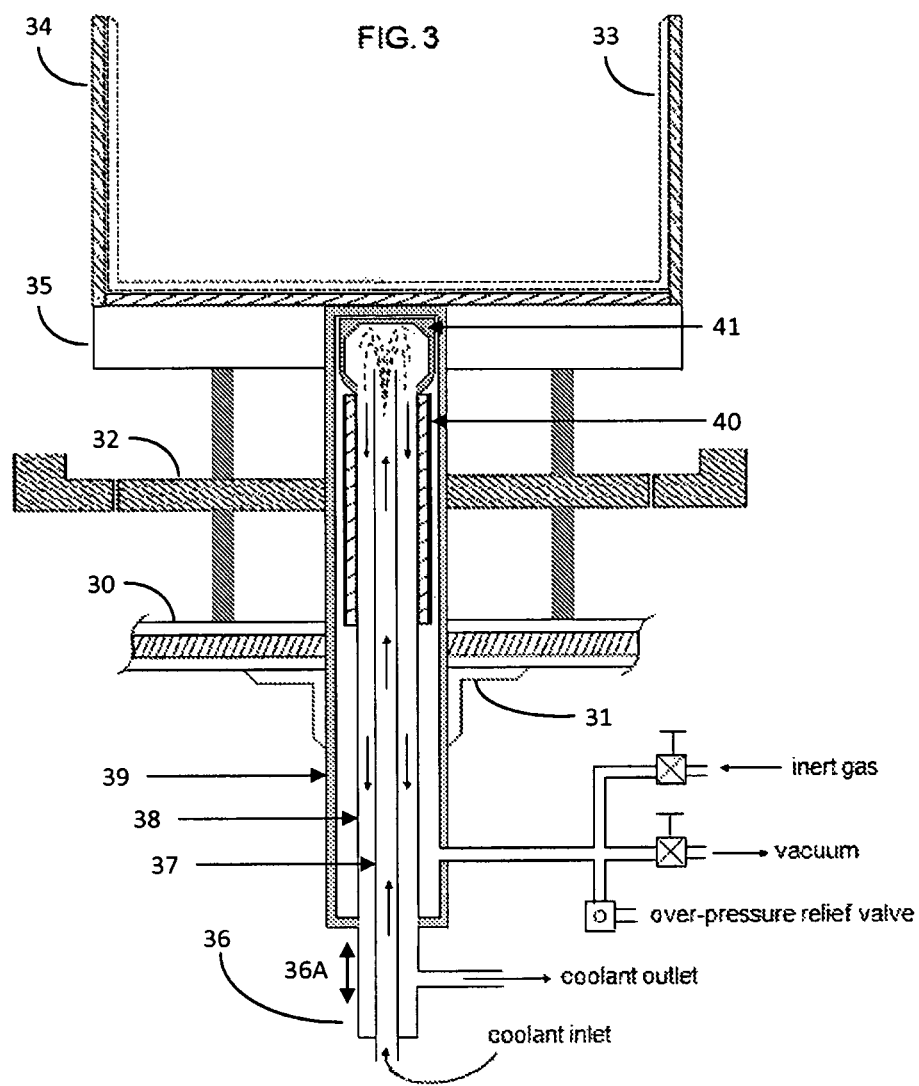

LIQUID-COOLED HEAT EXCHANGER

CROSS-REFERENCE TO RELATED APPLICATIONS

The present application claims the benefit of U.S. Provisional Patent Application No. 61/514,019, filed Aug. 1, 2011.

BACKGROUND OF THE INVENTION

1. Field of Invention

The present invention relates to a crystal growth furnace comprising a liquid-cooled heat exchanger that is vertically movable beneath a crucible.

2. Description of the Related Art

Crystal growth furnaces are used to produce crystalline materials from melted feedstock material. Feedstock is first melted in a crucible and then re-solidified into crystalline materials, for example into crystalline ingots. Several methods are used to produce crystalline ingots from melted feedstock. For example, the Czochralski (CZ), directional solidification (DSS) and heat exchanger method (HEM) furnaces can all be used to melt silicon feedstock material to produce a crystalline silicon ingot. However, the means by which the melted feedstock is re-solidified into an ingot differ between them. In the CZ method, silicon ingots are produced from melted feedstock by first dipping a silicon seed, suspended from above, into the melt and then slowly "pulling" the partially melted seed up and out of the melt so the silicon begins to cool and solidify from the "top-down" to form a silicon ingot, also known as a boule. The ingot formed is single crystal in nature and highly suitable for semiconductor and photovoltaic applications. However, the relatively small size of the silicon ingot produced by the CZ method, relative to the cost of production, makes this method generally impractical for producing the large quantities and large ingot sizes needed to make silicon wafers for the photovoltaic industry.

Unlike CZ, the DSS and the HEM methods re-solidify molten feedstock material into crystalline ingots from the bottom of the crucible "up", generally in the same crucible the feedstock was melted in. These methods may be used to produce larger ingot sizes than CZ. Several kinds of crystalline ingots can be produced by the DSS and HEM methods, for example, silicon and sapphire ingots. However, the manner in which molten feedstock material is re-solidified in the DSS and HEM methods differ due to their furnace configurations. Typically in a DSS system, a square crucible containing feedstock is heated, the feedstock is fully melted and then heat from the molten feedstock is allowed to radiate from the entire bottom of the crucible to the water-cooled furnace chamber wall below. This method of cooling the crucible from below produces a temperature gradient in the crucible that promotes the "bottom-up" solidification to form an ingot.

Unlike the DSS method, the HEM method produces a temperature gradient in molten material by positioning a heat exchanger in thermal communication with the crucible bottom to extract heat away from the molten material in a more focused manner. Coolant, for example, certain gases, circulating through the top of the heat exchanger, carries away extracted heat from the crucible bottom to initiate crystallization and promote the "bottom-up" solidification to produce an ingot. Helium is commonly used in furnace heat exchangers as a coolant. However, helium, as with other cooling gases, has no appreciable mass and so has little capacity to absorb large quantities of heat from crucibles containing molten material. As a result, large quantities of gas must be circulated through the heat exchanger to maintain the heat path and flow of heat from the melt, through the crucible and into the heat exchanger to promote and maintain crystal growth.

Unlike gas coolants, liquid coolants have appreciable mass. Water, for instance, is an exceptional liquid coolant because it has appreciable, mass and therefore has significant capacity to absorb large amounts of heat from the crucible. However, its use as a liquid coolant in heat exchangers in crystal growth furnaces has been guarded because any water leak from the liquid-cooled heat exchanger into the furnace chamber could potentially generate significant amounts of steam pressure.

As such, there is a need in the industry to take advantage of the superior cooling capacity of a liquid coolant comprising water over coolant gases used in heat exchangers to grow crystalline materials.

SUMMARY OF THE INVENTION

The present invention relates to a crystal growth furnace comprising a liquid-cooled heat exchanger beneath a crucible containing at least feedstock to be melted. The liquid-cooled heat exchanger is vertically movable beneath the crucible into thermal communication with the crucible to promote the re-solidification of the melted feedstock material into a crystalline ingot, and comprises a heat extraction bulb made of a material having a thermal conductivity value of greater than about 200 W/(m·k) and a liquid coolant inlet tube and liquid coolant outlet tube wherein the inlet tube, the outlet tube, or both tubes are attached to the heat extraction bulb for circulating a liquid coolant therethrough. Preferably, the material comprises copper and the liquid coolant comprises water. In one embodiment, the liquid-cooled heat exchanger is vertically movable into thermal contact with the crucible. In another embodiment, the crucible sits atop a crucible support and the liquid-cooled heat exchanger is vertically movable into thermal contact with the crucible support. In another embodiment, preferably where the at least feedstock material to be melted is silicon, the crucible sits in a crucible box atop a crucible support and the liquid-cooled heat exchanger is vertically movable into thermal contact with the crucible support. In another embodiment, the crystal growth furnace comprises a liquid-cooled heat exchanger that is enclosed and vertically movable in a sealed tubular outer jacket beneath the crucible.

The present invention further relates to a method for producing a crystalline ingot in a crystal growth furnace comprising the steps of placing a crucible containing at least feedstock material in the crystal growth furnace, circulating a liquid coolant through a liquid-cooled heat exchanger that is vertically movable beneath the crucible, heating and melting the at least feedstock material in the crucible, and vertically moving the liquid-cooled heat exchanger into thermal communication with the crucible in order to promote the growth of the crystalline ingot. The liquid-cooled heat exchanger comprises a heat extraction bulb made of a material having a thermal conductivity value of greater than about 200 W/(m·k) and a liquid coolant inlet tube and a liquid coolant outlet tube wherein the inlet tube, the outlet tube, or both are attached to the heat extraction bulb for circulating the liquid coolant through it.

It is to be understood that both the foregoing general description and the following detailed description are exem-

BRIEF DESCRIPTION OF THE DRAWINGS

FIG. 3 is a cross-sectional expanded view of the crystal growth furnace of FIG. 2.

DETAILED DESCRIPTION OF THE INVENTION

Figure 1:
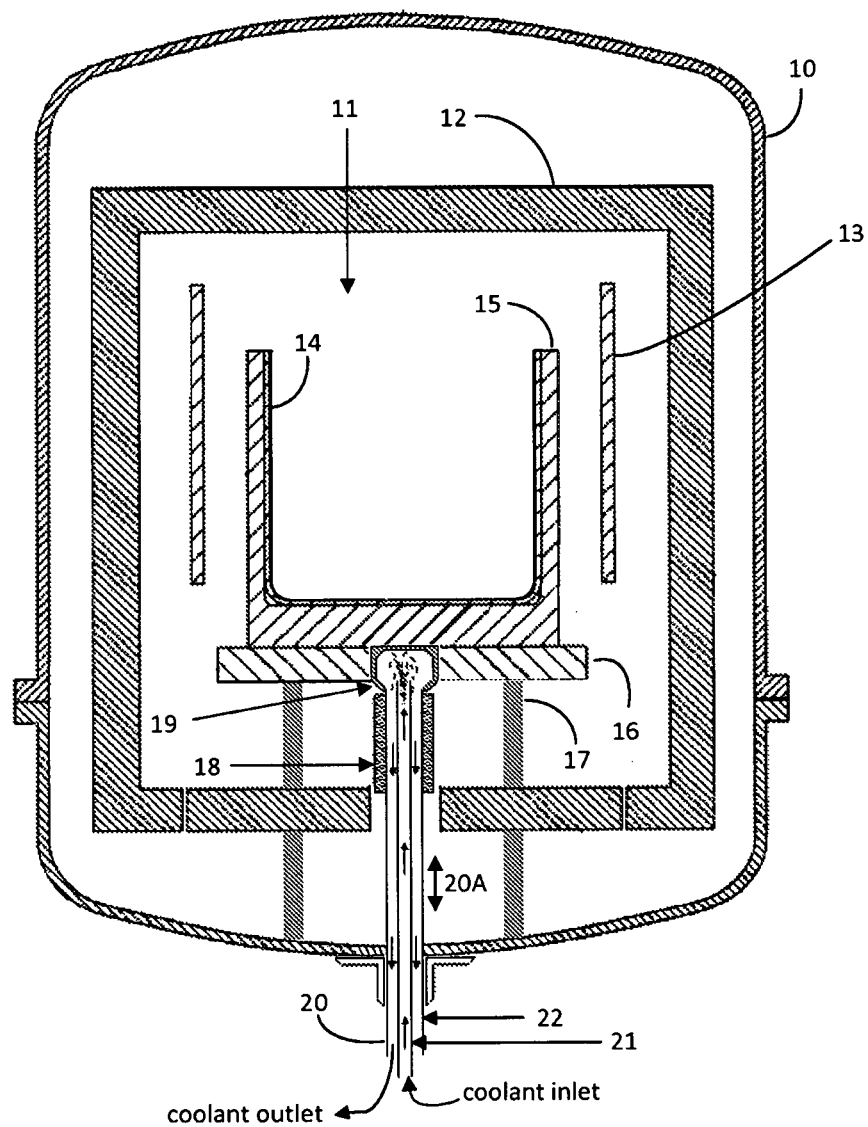
FIG. 1 and FIG. 2 are each a cross-sectional view of different embodiments of the crystal growth furnace of the present invention.

The present invention relates to a crystal growth furnace comprising a liquid-cooled heat exchanger that is vertically movable beneath a crucible containing at least feedstock to be melted and re-solidified into a crystalline ingot, and a method of producing a crystalline ingot from melted feedstock.

The crystal growth furnace of the present invention is a high-temperature furnace capable of heating and/or melting feedstock material, including, but not limited to, silicon, at temperatures generally greater than about 1000° C. and subsequently promoting re-solidification of the molten feedstock material to form a crystalline ingot, for instance, a multi-crystalline silicon ingot. For example, the crystal growth furnace can be a directional solidification system (DSS) or a heat exchanger (HEM) crystal growth furnace. The feedstock material can be solid or liquid in form. The material to be melted is at least feedstock material, for example, polysilicon feedstock, although a seed crystal can be used in conjunction with feedstock material, for example, a monocrystalline silicon seed, if a crystalline material that is monocrystalline or substantially monocrystalline is desired. Other crystalline ingots may be produced using the crystal growth furnace of the present invention including, for example, germanium, calcium fluoride and magnesium fluoride.

The crystal growth furnace of the present invention comprises a crucible containing feedstock material to be melted in the hot zone of the furnace and a liquid-cooled heat exchanger that is vertically movable beneath the crucible. The hot zone of the crystal growth apparatus is an interior region within the furnace in which heat can be provided and controlled to melt and re-solidify a feedstock material in a crucible. The hot zone is surrounded by and defined by insulation, which can be any material known in the art that possesses low thermal conductivity and is capable of withstanding the temperatures and conditions in a high temperature crystal growth furnace. For example, the hot zone can be surrounded by insulation of graphite. The shape and dimension of the hot zone can be formed by a plurality of insulation panels which can either be stationary or mobile. For example, the hot zone may be formed of top, side, and bottom insulation panels, with the top and side insulation panels configured to move vertically relative to a crucible placed within the hot zone. Other insulation dimensions may be used depending on the furnace hot zone shape, for example, cylindrical insulation would typically surround a cylindrical hot zone.

The hot zone also comprises at least one heating system, such as multiple heating elements to provide heat to melt a solid feedstock placed in the crucible. For example, the hot zone can comprise a top heating element, positioned horizontally in the upper region of the hot zone above the crucible, and at least one side heating element positioned vertically below the top heating element and along the sides of the hot zone and the crucible. The temperature in the hot zone may be increased to melt feedstock material and then reduced to aid in its re-solidification by regulating the power provided to the various heating elements.

The hot zone further comprises a crucible, optionally within a crucible box, atop a crucible support in the hot zone. Preferably, the crucible is non-rotatable and is stationary. The crucible can be made of various heat resistant materials, for example, quartz (silica), graphite, molybdenum, silicon carbide, silicon nitride, composites of silicon carbon or silicon nitride with silica, pyrolytic boron nitride, alumina, or zirconia and, optionally, may be coated, such as with silicon nitride, to prevent cracking of the ingot after solidification. The crucible can also have a variety of different shapes having at least one side and a bottom, including, for example, cylindrical, cubic or cuboid (having a square cross-section), or tapered. Preferably, when the feedstock is silicon, the crucible is made of silica and has a cube or cuboid shape.

The crucible can optionally be contained within a crucible box, which provides support and rigidity for the sides and bottom of the crucible and is particularly preferred for crucibles made of materials that are either prone to damage, cracking, or softening, especially when heated. For example, a crucible box is preferred for a silica crucible but may be unnecessary for a crucible made of silicon carbide, silicon nitride, or composites of silicon carbide or silicon nitride with silica. The crucible box can be made of various heat resistant materials, such as thermally conductive high density graphite, and typically comprises at least one side plate and a bottom plate, optionally further comprising a lid. For example, for a cube or cuboid-shaped crucible, the crucible box is preferably also in the shape of a cube or cuboid, having four walls and a bottom plate, with an optional lid.

The crucible and optional crucible box can further be provided on top of a crucible support within the hot zone, and, as such, would be in thermal communication with each other so that heat can be conducted from one to the other, preferably by direct thermal contact. The crucible support can be raised on a plurality of pedestals in order to place the crucible into a central position in the crystal growth furnace. The crucible support can be made of any heat resistant material and is preferably a similar material to the crucible box, if used. For example, the crucible box and crucible support are typically made of high density graphite material that is thermally conductive. The crucible support may also comprise an opening, particularly at its center, that is sized and shaped to receive the heat extraction bulb of the liquid-cooled heat exchanger described below, so that the bulb may thermally communicate with the crucible box to extract heat through it. The present invention also contemplates an opening in the crucible support sized and shaped to receive a sealed tubular outer jacket containing the liquid-cooled heat exchanger, also described in detail below.

The crystal growth furnace further comprises a liquid-cooled heat exchanger beneath the crucible. The liquid-cooled heat exchanger is configured to be vertically movable into thermal communication with the crucible bottom, particularly at its center, to conduct heat away from the molten feedstock and into liquid coolant circulating through the heat exchanger. Preferably, the liquid-cooled heat exchanger is not rotatable. The liquid coolant can be any liquid material capable of flowing through the liquid-cooled heat exchanger and removing heat from beneath the crucible containing a liquid feedstock melt formed in the crucible. Preferably, the liquid coolant comprises water.

The liquid-cooled heat exchanger comprises a heat extraction bulb made of a specifically chosen material and further comprises a liquid coolant inlet tube and liquid coolant outlet tube. The liquid coolant inlet tube, the liquid coolant outlet tube, or both tubes are attached to the heat extraction bulb for circulating the liquid coolant therethrough. The heat extraction bulb is made of a material, particularly a metallic material, having a thermal conductivity value of greater than about 200 W/(m·k). For example, the heat extraction bulb can be made of copper, though other metallic materials possessing high thermal conductivity, such as silver or gold, may also be used. Preferably, the material has a melting point below the melting point of the feedstock. Materials that are particularly useful are those where the difference between the melting point of the feedstock and the melting point of the metallic material of the heat extraction bulb is not more than about 455° C., particularly not more than about 330° C. Physically, the heat extraction bulb has a flat outer top surface that is horizontal to the crucible bottom. For example, the outer top surface can have an outer diameter of approximately about 4 inches. Internally, the heat extraction bulb has an internal cavity for receiving coolant from the inlet tube and discharging coolant carrying heat extracted from the crucible bottom through the outlet tube. The internal cavity can have the same or different shape as the outer top surface and can be, for example, spherical or bulbous in shape. The size of the cavity will depend on the thickness of the heat extraction bulb. For example, a bulb having an outer diameter of about 4 inches can have an internal cavity of approximately about 2.5 inches wide that is bulbous in shape, with no angular corners. Preferably, the conducting metal surface of the heat extraction bulb above the internal cavity is approximately about 0.25 inches thick. Other widths and cavity shapes and inner dimensions are contemplated in the present invention so long as the width, cavity size or inner dimensions of the heat extraction bulb provide for adequate water pressure and water flow to efficiently cool the heat extraction bulb.

Liquid coolant is provided to and discharged from the heat extraction bulb by a liquid coolant inlet tube and a liquid coolant outlet tube, respectfully. The inlet and outlet tubes can be made of a variety of materials so long as the material can withstand the furnace temperatures they are exposed to. In a preferred embodiment, the liquid coolant inlet tube and liquid coolant outlet tubes are coaxial wherein the liquid coolant inlet tube is inside the liquid coolant outlet tube or the liquid coolant outlet tube is inside the liquid coolant inlet tube. In a preferred embodiment, the liquid coolant inlet tube extends into the heat extraction bulb to deliver liquid coolant to the bulb, exiting through the liquid coolant outlet tube sealed to the base of the heat extraction bulb to exit the furnace. While the preferred embodiment of present invention utilizes a coaxial tubes to deliver liquid coolant to the heat extraction bulb, other delivery configurations will be recognized by one of ordinary skill in the art, including liquid coolant inlet tubes and liquid coolant outlet tubes that are separately sealed to the heat extraction bulb and external to each other. Liquid coolant inlet and outlet tubes can be attached to the heat extraction bulb by a variety of means known in the art, for example, by silver soldering.

The liquid coolant inlet and outlet tubes can additionally be enclosed in one or more insulation sheaths to prevent the liquid coolant circulating to the heat extraction bulb from absorbing excessive ambient heat from the hot zone that would reduce its cooling efficiency and heat load capacity. The insulation sheath can surround that portion of the inlet and outlet tubes residing inside the hot zone, extending vertically downward from the base of the heat extraction bulb, to maintain the temperature of the coolant entering the heat extraction bulb. Preferably, the insulation sheath comprises alumina or low density graphite felt though other materials known in the art to possess low thermal conductivity are also contemplated by the present invention. A conventional O-ring or bellows seal below and outside the furnace can be used to seal around the liquid coolant inlet and outlet tubes of the liquid-cooled heat exchanger that extend outside the crystal growth furnace to maintain the environment inside the furnace.

The liquid-cooled heat exchanger can further be contained within a sealed tubular outer jacket that serves to enclose and isolate it from the internal furnace environment. The sealed tubular outer jacket can comprise molybdenum although other materials known in the art, such as graphite, may also be used as long as these other materials can withstand the furnace temperatures contemplated. The jacket can have a closed crucible end having an outer and inner top surface that can be positioned to be parallel and in close proximity to the crucible bottom, and an outside furnace end extending through the bottom of the furnace. Internally, the jacket is appropriately shaped and sized to accommodate and vertically support the liquid-cooled heat exchanger so that it can move smoothly along the internal surface of the jacket when the liquid-cooled heat exchanger is vertically moved toward the crucible. The sealed tubular outer jacket may either be stationary or vertically movable. For example, the sealed tubular outer jacket may be fixed in a vertical position extending from outside the furnace and through the furnace wall to a point beneath the crucible bottom. In another embodiment, the jacket is movable into position beneath the crucible. Preferably the outer jacket is not rotatable. As a particular example, the sealed tubular outer jacket can be a non-rotatable crucible support shaft. A conventional O-ring or bellows seal or other sealing means known in the art may be used to seal around the sealed tubular outer jacket outside the furnace to maintain the environment inside the furnace. Similarly, the outside furnace end of the jacket may be configured to seal around the liquid coolant inlet and outlet tubes extending outside of the sealed tubular outer jacket to maintain a controlled environment inside the jacket.

Outside the furnace, the sealed tubular outer jacket can further comprise a vacuum port and inert gas injection port for evacuating the jacket and backfill the jacket with inert gas, respectively, which helps to minimize heat-induced oxidation of the jacket's internal surfaces and liquid-cooled heat exchanger components. For example, the interior volume of the jacket can be backfilled with argon gas and held to a pressure of 5-15 psig. In addition, the jacket can also comprise an over-pressure relief valve outside the furnace. Should a coolant leak, for example, water, occur while operating the liquid-cooled heat exchanger at high furnace temperatures, the leak would be contained inside the sealed tubular outer jacket and any resulting steam pressure that might result would be vented outside the furnace.

The liquid-cooled heat exchanger is vertically movable beneath and into thermal communication with the crucible to extract heat from melted feedstock material to promote crystalline ingot growth. For example, the liquid-cooled heat exchanger may be motorized and can be moved in a plurality of stages beneath the crucible in conjunction with a feedback monitoring system used in growing crystalline materials. When the crucible is contained in a crucible box on a crucible support in the hot zone, the crucible, crucible box and crucible support are in thermal communication with each other so that heat can be conducted from one to the other, preferably by direct thermal contact. Similarly, when the crystal growth furnace comprises a crucible on a crucible support in the hot zone, the crucible is in thermal communication with the crucible support and so heat can be conducted from one to the other. As such, when the liquid-cooled heat exchanger is vertically moved into thermal contact with the undersurface of the crucible support, a thermal pathway is established and the heat extraction bulb is placed in thermal communication with the crucible. Similarly, when the liquid-cooled heat exchanger is enclosed in a sealed tubular outer jacket in thermal contact with the undersurface of the crucible support, the thermal pathway is established when the heat extraction bulb is vertically moved into thermal contact with the inner top surface of the jacket and the outer top surface of the jacket is in thermal contact with the undersurface of the crucible support. As noted above, when the crucible support has an opening sized and shaped to receive the heat extraction bulb or the sealed tubular outer jacket through it, the heat extraction bulb is placed in thermal communication, preferably by direct thermal contact, with the crucible or crucible box containing the crucible to facilitate heat extraction. Where the opening enters, but does not go through the crucible support, thermal communication is still established so long as the crucible or crucible box containing a crucible, are in thermal communication with each other and the heat extraction bulb. The present invention also contemplates a crucible supported on an open retainer ring that allows the heat extraction bulb of the liquid-cooled heat exchanger to make thermal contact directly with the crucible bottom, or indirectly through the inner top surface of the sealed tubular outer jacket in direct contact with the crucible bottom.

Figure 2:
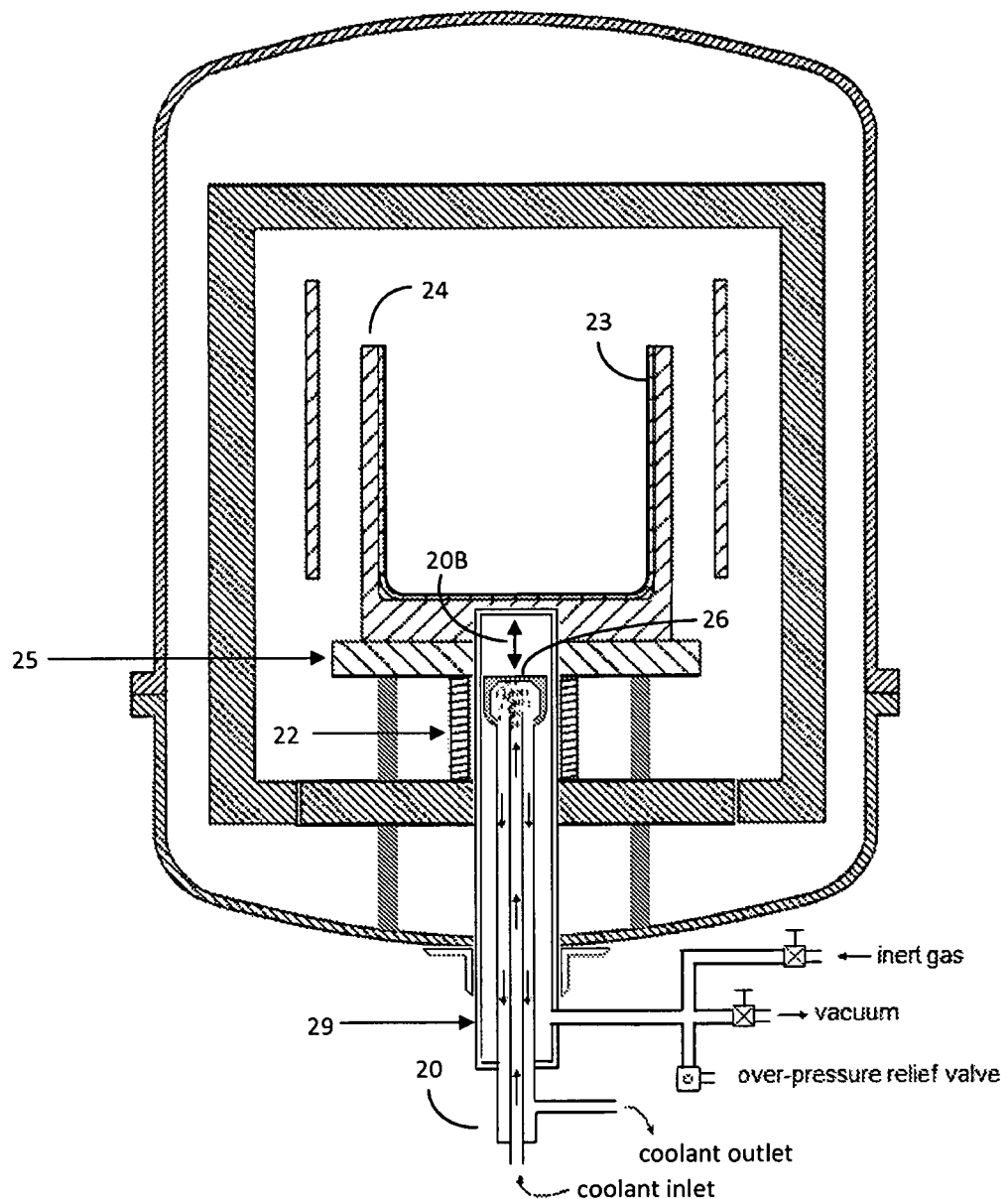

FIG. 1, FIG. 2 and FIG. 3 are cross-sectional views of various embodiments of the crystal growth furnace of the present invention. However, it should be apparent to those skilled in the art that these are merely illustrative in nature and not limiting, being presented by way of example only. Numerous modifications and other embodiments are within the scope of one of ordinary skill in the art and are contemplated as falling within the scope of the present invention. In addition, those skilled in the art should appreciate that the specific configurations are exemplary and that actual configurations will depend on the specific system. Those skilled in the art will also be able to recognize and identify equivalents to the specific elements shown, using no more than routine experimentation.

The crystal growth furnace shown in FIG. 1 comprises a furnace shell 10 and a hot zone 11 surrounded and defined by insulation 12. Within hot zone 11, crucible 14 containing at least feedstock to be melted (not shown), for example silicon feedstock, sits in crucible box 15 atop crucible support 16 raised on pedestals 17. At least side heaters 13 are employed around crucible 14 to melt the feedstock material to produce a crystalline silicon ingot. Additionally, a top heater (not shown) can also be used in conjunction with side heaters 13 to melt feedstock in the crucible. Insulation 12 generally comprises top insulation above crucible 14, side insulation between side heaters 13 and the furnace shell 10 and bottom insulation as shown. In one embodiment of the present invention, the top, side and bottom insulation are movable together or individually relative to crucible 14, to release heat from the hot zone to the water-cooled furnace shell 10 below to assist in the re-solidification of melted feedstock.

The crystal growth furnace shown in FIG. 1 further comprises a liquid-cooled heat exchanger 20 beneath crucible 14 at its center that is vertically movable as indicated by arrow 20A. Liquid-cooled heat exchanger 20 comprises a liquid coolant inlet tube 21 and a liquid-coolant outlet tube 22 coaxial to each other wherein the coolant inlet tube is inside the coolant outlet tube which is sealed to heat exchanger bulb 19. An insulation sheath 18 surrounds the portion of the liquid coolant inlet tube and a liquid-coolant outlet tube exposed to the hot zone 11 environment so that the liquid-cooled heat exchanger can be placed in a retracted position below the hot zone during the heating and melting of the feedstock. In the embodiment shown in FIG. 1, liquid-cooled heat exchanger 20 is vertically movable so that heat extraction bulb 19 extends through an opening in crucible support 16 sized and shaped to the receive the bulb into thermal contact with crucible box 15. Once contacted, a thermal path from crucible 14 through crucible box 15 to heat exchanger bulb 19 is established, placing crucible 14 and heat exchanger bulb 19 in thermal communication with each other so that heat exchanger bulb 19 can extract heat from the bottom of crucible 14.

FIG. 2 shows another embodiment of the present invention wherein liquid-cooled heat exchanger 20 is enclosed in a sealed tubular outer jacket 29 beneath crucible 23. Here, the sealed tubular outer jacket 29 extends through an opening in crucible support 25 and into a partial opening in crucible box 24 containing crucible 23, and insulation sheath 22 is employed on the outside of the jacket. Alternatively, in another embodiment, insulation sheath 22 can be employed inside the sealed tubular outer jacket 29. The present invention contemplates that crucible box 24 and crucible support 25 are made of high density graphite having high thermal conductivity to maintain thermal flow. Various opening depths in crucible box 24 and crucible support 25 used to receive the sealed tubular outer jacket 29 are envisioned by the present invention. As shown in FIG. 2, liquid-cooled heat exchanger 20 is only partially vertically moved in the sealed tubular outer jacket 29 as indicated by arrow 20B. Once fully moved to the top of sealed tubular outer jacket 29, heat extraction bulb 26 contacts the inner top surface of the jacket and a thermal path from crucible 23 through crucible box 24 to heat exchanger bulb 26 is established, placing crucible 23 and heat exchanger bulb 26 in thermal communication with each other so that heat exchanger bulb 26 can extract heat from the bottom of crucible 23 containing melted feedstock and into the liquid coolant flowing through it.

A more detailed description of the sealed tubular outer jacket is shown in FIG. 3 which is an expanded view of the embodiment of the present invention shown in FIG. 2, wherein the liquid-cooled heat exchanger 36 is enclosed in a sealed tubular outer jacket 39 and vertically moved within the jacket into position to extract heat from the crucible. The jacket extends through furnace wall 30 sealed with seal 31, which can be conventional O-rings, a bellows seal or other means of sealing known in the art, to maintain the environment within the furnace, and through hot zone insulation 32 and into an opening in crucible support 35 that is sized and shaped to receive the jacket into thermal contact with crucible box 34 containing crucible 33. In the embodiment shown, insulation sheath 40 encloses liquid coolant inlet tube 37 and liquid coolant outlet tube 38 inside the sealed tubular outer jacket 39. Here, the insulation sheath can physically cover more surface area on the inlet and outlet tubes owing to the increase in retractable space afforded by the jacket. As shown, the crucible end of sealed tubular outer jacket 39 does not make contact with the bottom of crucible 33 directly; rather, the outer top surface of the jacket makes thermal contact with crucible box 34 directly. However, when liquid-cooled heat exchanger 36 is vertically moved upwards as indicated by arrow 36A, the heat extraction bulb 41 makes thermal contact with the inner surface of the top of the sealed tubular outer jacket 39 already in thermal contact with crucible box 34, establishing a thermal pathway and placing heat extraction bulb 41 in thermal communication with crucible 33. Other embodiments are envisioned to extract heat from the crucible using liquid-cooled heat exchanger 36, either alone or when enclosed in a sealed tubular outer jacket, so long as the heat extraction bulb 41 thermally communicates, preferably by direct thermal contact, with one or more thermally conductive intermediate structures, for example, crucible box 34 and/or crucible support 35, that are in thermal contact with each other and crucible 33, so that a thermal path is established that allows heat exchanger bulb 41 to thermally communicate with crucible 33. The present invention also contemplates using the sealed tubular outer jacket in combination with liquid cooled heat exchanger as a vertically movable crucible support shaft for possible use in other crystal growth furnace configurations where the crucible is not movable in relation to the shaft, and the shaft is not rotatable.

The present invention relates to a liquid-cooled heat exchanger for use in a crystal growth furnace to economically and safely grow a variety of crystalline materials from melted feedstock, including, but not limited to, silicon. The liquid-cooled heat exchanger combines the desired properties of a heat extraction bulb made of a high thermal conductivity material such as copper with the high thermal load capability afforded by a liquid coolant such as water, to efficiently remove heat from beneath the crucible to promote crystal nucleation and ingot growth. The heat extraction bulb of the present invention can be made of various types of materials, such as metallic materials, having high thermal conductivity properties. Table 1 shows three of the highest thermally conductive metals commonly known, with silver possessing the highest thermal conductivity, followed by copper and gold. Copper may be preferable due to its high thermal conductivity and relatively low cost in comparison to silver and gold.

TABLE 1

| Material | Thermal Conductivity [in Watts per meter Kelvin (W/m · k)] | Melting Point (° C.) |
| --- | --- | --- |
| Silver | 430 | 961.78 |
| Copper | 400 | 1084.62 |
| Gold | 320 | 1064.18 |
| Aluminum | 235 | 660.32 |
| Tungsten | 170 | 3422 |
| Molybdenum | 139 | 2623 |
| Stainless Steels | 16 | 1325-1530 (melting range for common stainless steel grades) |

It has surprisingly been found that it is possible to use a heat extraction bulb made of a material having a thermal conductivity value of greater than about 200 W/(m·k), such as a copper heat extraction bulb, in conjunction with a liquid coolant, such as water, to effectively extract heat from a crucible containing molten feedstock, such as silicon, particularly if the bulb material has a melting point below that of the feedstock. For example, copper's melting point (approximately 1085° C.) is approximately 330° C. lower than the melting temperature of silicon. However, it has been found that a copper heat extraction bulb with circulating water as the coolant can effectively remove heat and promote growth of a silicon ingot without damage. It is believed that the high thermal conducting property of copper, in combination with the high thermal load carrying capacity of water circulating through the copper heat extraction bulb, results in a high heat extraction efficiency that is responsible for maintaining the structural integrity of the copper heat extraction bulb, even when put in thermal contact with surfaces above its melting point. The same high heat extraction efficiency realized when combining a high thermal conductivity metal with water as a coolant would be expected to similarly maintain the structural integrity of a water cooled silver heat extraction bulb used to extract heat from a crucible containing molten silicon that is approximately 450° C. higher than silver's melting point. Because the liquid coolant inlet and outline lines are insulated inside the furnace, cooling only occurs at the heat extraction bulb to initiate nucleation and subsequent crystal growth in the crucible. When enclosed in a tubular outer jacket designed to vent steam pressure that may result from a water leak inside, the liquid-cooled heat exchanger additionally provides a safe means to take advantage of the high thermal conductive property of the heat extraction bulb cooled by a liquid coolant like water.

The present invention further relates to a method for producing a crystalline ingot in the crystal growth furnace, described in more detail above, employing a liquid-cooled heat exchanger beneath the crucible to extract heat from the crucible to promote crystal ingot growth. The method comprises the steps of placing a crucible containing at least feedstock in the crystal growth furnace, circulating liquid coolant through the liquid-cooled heat exchanger, heating and melting the at least feedstock material in the crucible, and vertically moving the liquid-cooled heat exchanger into thermal communication with the crucible in order to promote the growth of the crystalline ingot. When the present invention employs a liquid-cooled heat exchanger enclosed in a tubular outer jacket, the method for producing a crystalline ingot comprises the steps of placing a crucible containing at least feedstock in the crystal growth furnace, circulating liquid coolant through the liquid-cooled heat exchanger, evacuating the sealed tubular outer jacket and backfilling the evacuated jacket with an inert gas, preferably argon gas to a pressure of 5-15 psig, heating and melting the at least feedstock in the crucible, and vertically moving the liquid-cooled heat exchanger into thermal communication beneath and with the crucible in order to promote the growth of the crystalline ingot.

The foregoing description of preferred embodiments of the present invention has been presented for the purposes of illustration and description. It is not intended to be exhaustive or to limit the invention to the precise form disclosed. Modifications and variations are possible in light of the above teachings, or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:
1. A crystal growth furnace for growing a crystalline ingot comprising:
   a crucible containing at least feedstock material; and
   a liquid-cooled heat exchanger that is vertically movable beneath the crucible comprising:

a heat extraction bulb made of a material having a thermal conductivity value of greater than about 200 W/(m·k) and having a melting point below a melting point of the feedstock material in the crucible; and a liquid coolant inlet tube and a liquid coolant outlet tube, wherein the liquid coolant inlet tube, the liquid coolant outlet tube, or both are attached to the heat extraction bulb for circulating a liquid coolant therethrough.

2. The crystal growth furnace of claim 1, wherein the liquid coolant comprises water.

3. The crystal growth furnace of claim 1, wherein the melting point of the feedstock and the melting point of the material differ by not more than about 455° C.

4. The crystal growth furnace of claim 1, wherein the melting point of the feedstock and the melting point of the material differ by not more than about 330° C.

5. The crystal growth furnace of claim 1, wherein the material comprises copper, silver or gold.

6. The crystal growth furnace of claim 1, wherein the heat extraction bulb has an internal cavity to receive the liquid coolant from the liquid coolant inlet tube and discharge the liquid coolant through the liquid coolant outlet tube.

7. The crystal growth furnace of claim 6, wherein the internal cavity is bulbous in shape.

8. The crystal growth furnace of claim 1, wherein the liquid coolant inlet tube and liquid coolant outlet tube are coaxial.

9. The crystal growth furnace of claim 8, wherein the liquid coolant inlet tube is inside the liquid coolant outlet tube.

10. The crystal growth furnace of claim 8, wherein the liquid coolant outlet tube is inside the liquid coolant inlet tube.

11. The crystal growth furnace of claim 1, wherein the liquid coolant inlet tube and liquid coolant outlet tube are enclosed in an insulation sheath within the furnace.

12. The crystal growth furnace of claim 11, wherein the insulation sheath is made of graphite or alumina.

13. The crystal growth furnace of claim 1, wherein the liquid-cooled heat exchanger is vertically movable into thermal contact with the crucible.

14. The crystal growth furnace of claim 1, wherein the crucible sits atop a crucible support and the liquid-cooled heat exchanger is vertically movable into thermal contact with the crucible support.

15. The crystal growth furnace of claim 14, wherein the crucible support comprises an opening that is sized and shaped to receive the heat extraction bulb and the heat extraction bulb is vertically movable into the opening.

16. The crystal growth furnace of claim 1, wherein the crucible sits in a crucible box atop a crucible support and the liquid-cooled heat exchanger is vertically movable into thermal contact with the crucible support.

17. The crystal growth furnace of claim 16, wherein the crucible support comprises an opening that is sized and shaped to receive the heat extraction bulb and the heat extraction bulb is vertically movable into the opening.

18. The crystal growth furnace of claim 1, wherein the liquid-cooled heat exchanger is in a sealed tubular outer jacket.

19. The crystal growth furnace of claim 18, wherein the liquid-cooled heat exchanger is vertically movable within the sealed tubular outer jacket into thermal communication with the crucible.

20. The crystal growth furnace of claim 18, wherein the crucible sits atop a crucible support and the liquid-cooled heat exchanger is vertically movable within the sealed tubular outer jacket into thermal communication with the crucible support.

21. The crystal growth furnace of claim 20, wherein the crucible support comprises an opening that is sized and shaped to receive the sealed tubular outer jacket.

22. The crystal growth furnace of claim 18, wherein the crucible sits in a crucible box atop a crucible support and the liquid-cooled heat exchanger is vertically movable within the sealed tubular outer jacket into thermal communication with the crucible support.

23. The crystal growth furnace of claim 22, wherein the crucible support comprises an opening that is sized and shaped to receive the sealed tubular outer jacket.

24. The crystal growth furnace of claim 18, wherein the sealed tubular outer jacket comprises molybdenum or graphite.

25. The crystal growth furnace of claim 18, wherein the sealed tubular outer jacket comprises a vacuum inlet port, an inert gas injection port and an over-pressure release valve outside the crystal growth furnace.

26. The crystal growth furnace of claim 18, wherein the sealed tubular outer jacket further comprises an inert gas.

27. The crystal growth furnace of claim 18, wherein the sealed tubular outer jacket is stationary.

28. The crystal growth furnace of claim 18, wherein the sealed tubular outer jacket is vertically movable.

29. The crystal growth furnace of claim 18, wherein the sealed tubular outer jacket is a crucible support shaft.

30. The crystal growth furnace of claim 1, wherein the feedstock material comprises polycrystalline silicon.

31. The crystal growth furnace of claim 1, wherein the crystalline ingot is silicon.

32. A method for producing a crystalline ingot in a crystal growth furnace, comprising:
    placing a crucible having at least feedstock material in the crystal growth furnace;
    circulating a liquid coolant through a liquid-cooled heat exchanger that is vertically movable beneath the crucible, wherein the liquid-cooled heat exchanger comprises a heat extraction bulb made of a material having a thermal conductivity value of greater than about 200 W/(m·k) and has a melting point below a melting point of the feedstock material in the crucible, a liquid coolant inlet tube and a liquid coolant outlet tube, wherein the liquid coolant inlet tube, the liquid coolant outlet tube, or both are attached to the heat extraction bulb for circulating the liquid coolant therethrough;
    heating and melting the at least feedstock material in the crucible; and
    vertically moving the liquid-cooled heat exchanger into thermal communication with the crucible in order to promote the growth of the crystalline ingot.

33. The method of claim 32, wherein vertically moving the liquid-cooled heat exchanger is controlled by feedback obtained by monitoring the melting of the at least feedback material.

34. The method of claim 32, wherein the liquid-cooled heat exchanger is enclosed in a sealed tubular outer jacket, and wherein the method further comprises the steps of evacuating the sealed tubular outer jacket and backfilling with inert gas before the step of heating and melting the at least feedstock in the crucible.

35. The method of claim 32, wherein inert gas is backfilled to at least about 5-15 psig.

* * * * *